(12) United States Patent
Veerasamy et al.

(10) Patent No.: US 7,052,585 B2
(45) Date of Patent: May 30, 2006

(54) COATED ARTICLE INCLUDING TITANIUM OXYCARBIDE AND METHOD OF MAKING SAME

(75) Inventors: Vijayen S. Veerasamy, Ann Arbor, MI (US); Scott V. Thomsen, Milford, MI (US); Rudolph Hugo Petrmichl, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 226 days.

(21) Appl. No.: 10/384,797

(22) Filed: Mar. 11, 2003

(65) Prior Publication Data

US 2004/0180216 A1    Sep. 16, 2004

(51) Int. Cl.
*C23C 14/34* (2006.01)
*C23C 16/00* (2006.01)

(52) U.S. Cl. .................. 204/192.16; 204/192.26; 204/192.27; 204/192.28; 427/523; 427/529; 427/530; 427/249.17; 427/249.19; 427/255.391

(58) Field of Classification Search ........... 204/192.16, 204/192.26, 192.27, 192.28; 427/523, 529, 427/530, 249.1, 249.7, 249.19, 249.17, 249.18, 427/255.391
See application file for complete search history.

(56) References Cited

U.S. PATENT DOCUMENTS

| | | | |
|---|---|---|---|
| 4,497,700 A * | 2/1985 | Groth et al. ........... 204/192.27 |
| 4,693,944 A | 9/1987 | Sugisawa et al. ........... 428/698 |
| 5,073,411 A | 12/1991 | Hale .......................... 427/252 |
| 5,135,808 A * | 8/1992 | Kimock et al. ............. 428/336 |
| 5,569,501 A | 10/1996 | Bailey et al. ............. 118/723 E |
| 5,637,353 A | 6/1997 | Kimock et al. ........ 427/255.34 |
| 5,653,812 A | 8/1997 | Petrmichl et al. ........... 427/577 |
| 5,770,261 A | 6/1998 | Nakamura et al. ....... 427/255.6 |
| 5,858,477 A | 1/1999 | Veerasamy et al. ......... 427/562 |
| 5,900,342 A | 5/1999 | Visser et al. .............. 430/58.8 |
| 6,077,569 A | 6/2000 | Knapp et al. ............... 427/534 |
| 6,261,693 B1 | 7/2001 | Veerasamy .................. 428/408 |
| 6,303,225 B1 | 10/2001 | Veerasamy .................. 428/408 |
| 6,334,938 B1 | 1/2002 | Kida et al. ............. 204/298.13 |
| 6,461,731 B1 | 10/2002 | Veerasamy et al. ......... 428/408 |
| 6,660,340 B1 * | 12/2003 | Kirkpatrick ................. 427/530 |

FOREIGN PATENT DOCUMENTS

| | | | |
|---|---|---|---|
| EP | 0997191 | * | 5/2000 |
| EP | 1 160 353 | | 12/2001 |
| EP | 0 937 013 | | 11/2002 |
| JP | 06-158273 | * | 7/1994 |
| WO | WO 01/59172 | | 8/2001 |

OTHER PUBLICATIONS

International Search Report mailed Mar. 8, 2005.

* cited by examiner

*Primary Examiner*—Rodney G. McDonald
(74) *Attorney, Agent, or Firm*—Nixon & Vanderhye P.C.

(57) ABSTRACT

A coated article is provided which includes a layer including titanium oxycarbide. In order to form the coated article, a layer of titanium oxide is deposited on a substrate by sputtering or the like. After sputtering of the layer including titanium oxide, an ion beam source(s) is used to implant at least carbon ions into the titanium oxide. When implanting, the carbon ions have sufficient ion energy so as to knock off oxygen (O) from $TiO_x$ molecules so as to enable a substantially continuous layer comprising titanium oxycarbide to form near a surface of the previously sputtered layer.

46 Claims, 6 Drawing Sheets

COATED ARTICLE INCLUDING TITANIUM OXYCARBIDE AND METHOD OF MAKING SAME

This application relates to a coated article including a layer comprising titanium oxycarbide, and a method of making the same. In certain example embodiments, a layer of titanium oxide (e.g., $TiO_x$, where x is from 1 to 3, preferably about 2) is sputter deposited on a substrate; and thereafter an ion source(s) using a high voltage is used to implant carbon (C) ions with high energy into the titanium oxide so as to form a layer comprising titanium oxycarbide.

BACKGROUND OF THE INVENTION

Contact angle $\theta$ in general is discussed in U.S. Pat. Nos. 6,303,225 and 6,461,731, the disclosures of which are hereby incorporated herein by reference. In certain instances, high contact angles are desired, while in other instances low contact angles are desired. The desired contact angle depends upon the situation in which an intended product is to be used.

It is known in the art to coat a glass substrate with a layer of titanium oxide (e.g., $TiO_2$, or other stoichiometry). A layer of titanium oxide, if provided as the outermost layer on a glass substrate, can achieve a rather low contact angle $\theta$ with a sessile drop of water after lengthy exposure to ultraviolet (UV) radiation and water.

However, titanium oxide layers are problematic with respect to durability. For example, the scratch resistance of a titanium oxide layer is not that much better than that of glass. As a result, coated articles with an exposed layer of titanium oxide are highly susceptible to damage (e.g., scratching) during transport and the like, and are problematic in this respect.

In view of the above, it is apparent that there exists a need in the art for a coated article that is more durable (e.g., scratch resistant) than is pure titanium oxide. In certain example instances, a low contact angle $\theta$ may also be desired.

BRIEF SUMMARY OF EXAMPLE EMBODIMENTS

According to certain example embodiments of this invention, a coated article is provided which includes a layer comprising titanium oxycarbide and/or titanium carbide. In order to form the coated article, a layer comprising titanium oxide (e.g., $TiO_x$, where x is from 1 to 3, preferably about 2) is deposited on a substrate by sputtering (e.g., magnetron sputtering) or any other suitable deposition technique. Other layer(s) may or may not be provided between the substrate and the layer comprising titanium oxide in different embodiments of this invention. After sputtering of the layer comprising $TiO_x$, an ion beam source(s) is used to implant at least carbon ions into the $TiO_x$. When implanting into the $TiO_x$ inclusive layer, the carbon ions have sufficient ion energy to penetrate the surface of the layer and knock off oxygen (O) atoms from $TiO_x$ molecules so as to enable a substantially continuous layer comprising titanium oxycarbide to form near a surface of the previously sputtered layer. In embodiments where the sputtered $TiO_x$ layer is sufficiently thick, the layer comprising titanium oxycarbide may be formed over a layer of $TiO_x$ which was originally a lower portion of the originally sputtered $TiO_x$ layer.

A relatively high voltage is required in the ion source(s) in order to provide sufficient energy for the carbon ions from the ion source to: (a) penetrate the surface and implant into the sputtered $TiO_x$ layer, (b) knock off oxygen from $TiO_x$ molecules, and (c) carry out (a) and (b) to an extent sufficient so that a substantially continuous layer of titanium oxycarbide can be formed. In order to achieve sufficient energy in this respect, according to certain example embodiments of this invention the ion source(s) uses an anode-cathode voltage of at least about 800 V, more preferably of at least about 1,500 V, even more preferably of at least about 2,000V, and still more preferably of at least about 2,500 V. For purposes of example only, in the case where the C ions are formed using acetylene ($C_2H_2$) as a feedstock gas in an ion source, the aforesaid ion source voltages translate into respective ion energies of at least about 200 eV per C ion, more preferably at least about 375 eV per C ion, even more preferably at least about 500 eV per C ion, and still more preferably of at least about 625 eV per C ion.

In certain example embodiments, C ions are implanted deep enough into the sputtered $TiO_x$ layer so as to enable a substantially continuous layer comprising titanium oxycarbide to form at least at a top portion thereof. This layer comprising titanium oxycarbide may include TiO, TiC, TiOC, OC, CC, CH, and/or combinations thereof. In certain example embodiments, at least some C ions (or C atoms) are implanted into the sputtered layer to a depth "d" of at least 25 Å below the top surface of the sputtered layer (more preferably at least 50 Å, even more preferably at least 100 Å).

The coated article made, as explained above, to include a layer comprising titanium oxycarbide has improved scratch resistance compared to that of a purely titanium oxide layer. Moreover, in certain example embodiments, the use of C implantation enables certain contact angle $\theta$ characteristics to be improved. For example, the resulting coated article may be capable of achieving lower contact angles $\theta$ (initial, or after UV/water exposure) than a layer of pure amorphous diamond-like carbon (DLC) and/or a layer of pure titanium oxide. The resulting coated article may also be capable of maintaining a low contact angle(s) $\theta$ for a longer period of time than a layer of titanium oxide. Thus, it can be seen that the implantation of C ions/atoms into the layer comprising titanium oxide is advantageous in several respects.

Optionally, in addition to the C ions which are implanted into the layer comprising titanium oxide to form the titanium oxycarbide, further ion beam deposition of carbon using high ion energy may take place over the titanium oxycarbide in certain example embodiments so that a thin layer comprising amorphous diamond-like carbon (DLC) with a large amount of $sp^3$ carbon-carbon bonds (e.g., at least 40% such bonds, more preferably at least 50% such bonds) may be formed over the oxycarbide. This additional DLC layer may be from 0 to 100 Å thick in certain example embodiments of this invention, more preferably from 1 to 40 Å thick, and most preferably from about 1 to 30 Å thick. This optional DLC layer may or may not be hydrogenated (e.g., from about 1–25% H, more preferably from about 3–18% H) or include other dopants in different embodiments of this invention, and may have a density of at least 2.4 gms/$cm^3$ in certain example instances. This DLC inclusive layer may serve to improve durability in certain example embodiments of this invention.

In certain example embodiments of this invention, there is provided a method of making a coated article, the method comprising: providing a glass substrate; sputtering a layer comprising titanium oxide $TiO_x$ (where x is from 1 to 3) on the substrate, thereby forming a sputtered layer; and utilizing at least one ion source using anode-cathode voltage of at least about 1,500 V to cause at least carbon ions to be directed toward the sputtered layer comprising titanium oxide so that at least some of the carbon ions are implanted into the sputtered layer to a depth of at least 25 Å below a surface of the sputtered layer.

In other example embodiments of this invention, there is provided a method of making a coated article, the method comprising: providing a substrate; forming a layer comprising a metal oxide on the substrate; and directing at least carbon ions toward the layer comprising the metal oxide, at least some of the carbon ions having an ion energy of at least 200 eV per carbon ion so that at least some of the carbon ions implant in the layer thereby forming a layer comprising an oxycarbide.

In other example embodiments of this invention, there is provided a coated article comprising a coating supported by a substrate, the coating comprising: a sputtered layer comprising a metal oxide, and at least carbon atoms which are ion beam implanted in the sputtered layer comprising the metal oxide, at least some of the carbon ions being implanted to a depth of at least 25 Å below a surface of the sputtered layer, thereby forming a layer comprising an oxycarbide.

DETAILED DESCRIPTION OF EXAMPLE EMBODIMENTS OF THE INVENTION

Certain embodiments of the instant invention relate to a coated article which includes a layer comprising titanium oxycarbide. In order to form the coated article in certain example embodiments, a layer of titanium oxide (e.g., $TiO_x$, where x is from 1 to 3, more preferably from 1.5 to 2.5, and most preferably about 2) is deposited on a substrate by sputtering (e.g., magnetron sputtering) or via any other suitable deposition technique. Other layer(s) may or may not be provided between the substrate and the titanium oxide in different embodiments of this invention. After sputtering of the layer comprising $TiO_x$, at least one ion beam source is used to implant carbon (C) ions into the $TiO_x$. When implanting into the $TiO_x$ layer, the carbon ions have sufficient ion energy so as to penetrate the surface of the sputtered layer, and knock off oxygen (O) from $TiO_x$ molecules so as to enable a substantially continuous layer comprising titanium oxycarbide to form near a surface of the previously sputtered layer. In embodiments where the sputtered $TiO_x$ layer is sufficiently thick, the layer comprising titanium oxycarbide may be formed over a layer of $TiO_x$ which was originally a lower portion of the originally sputtered $TiO_x$ layer.

The coated article including at least one substantially continuous layer comprising titanium oxycarbide has improved scratch resistance compared to that of a purely titanium oxide layer. Moreover, in certain example embodiments the use of the C implantation enables certain contact angle $\theta$ characteristics to be improved. For example, it has been found that the resulting coated article may be capable of achieving lower contact angles $\theta$ (initial, or after UV/water exposure) than would a layer of pure amorphous diamond-like carbon (DLC) and/or a layer of pure $TiO_2$. Surprisingly, the resulting coated article may also be capable of maintaining a low contact angle(s) $\theta$ for a longer period of time than would a layer of only titanium oxide. Thus, it can be seen that the implantation of C ions/atoms into the layer comprising titanium oxide is advantageous in several significant respects.

Coated articles herein comprising an oxycarbide, may be used in various commercial applications, including but not limited to insulating glass (IG) window units, vehicle windows, architectural windows, furniture applications, and/or the like.

Figure 1:
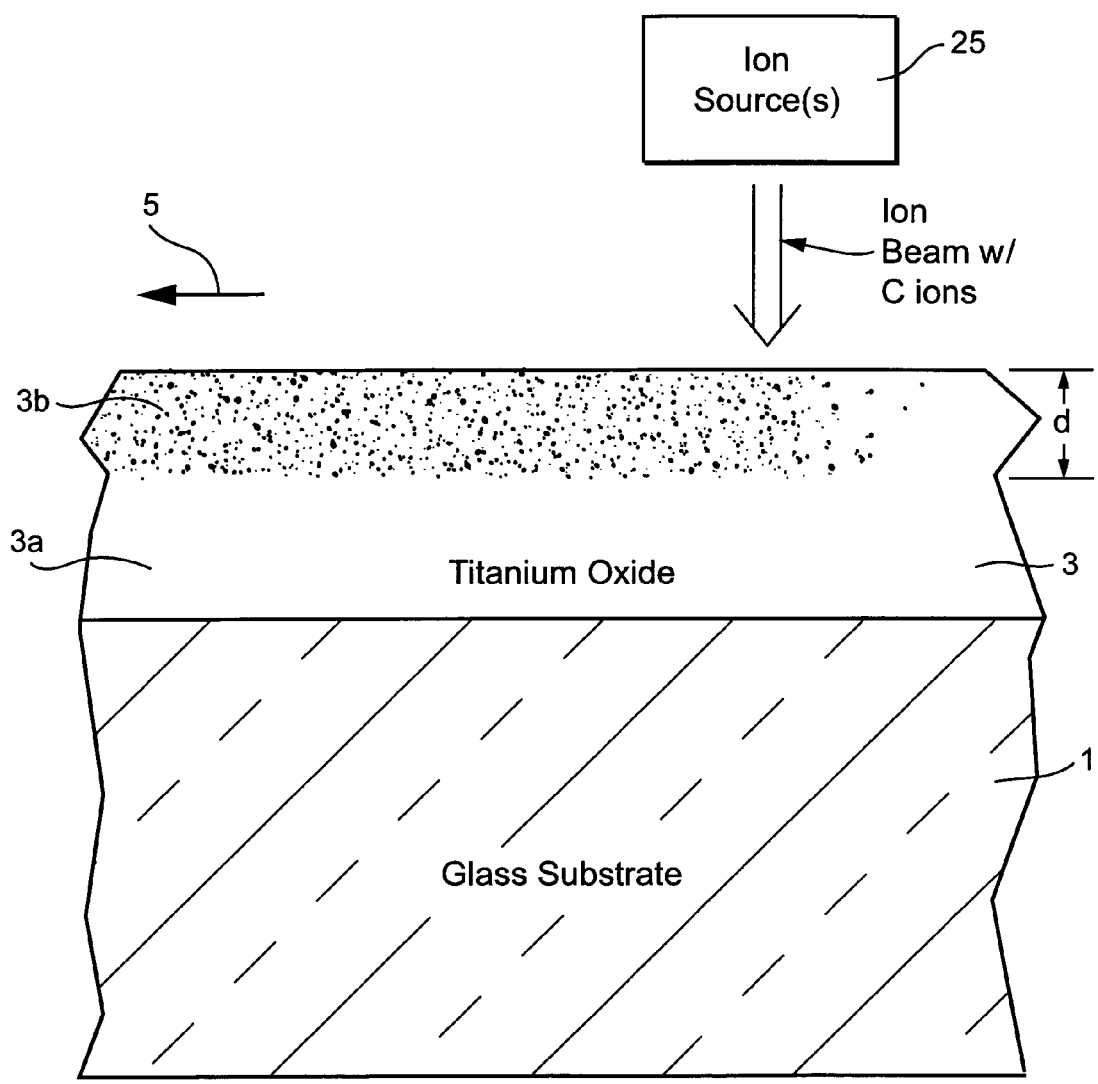
FIG. 1 is a schematic partial cross sectional view illustrating a technique for making a coated article according to an example embodiment of this invention.
Figure 2:
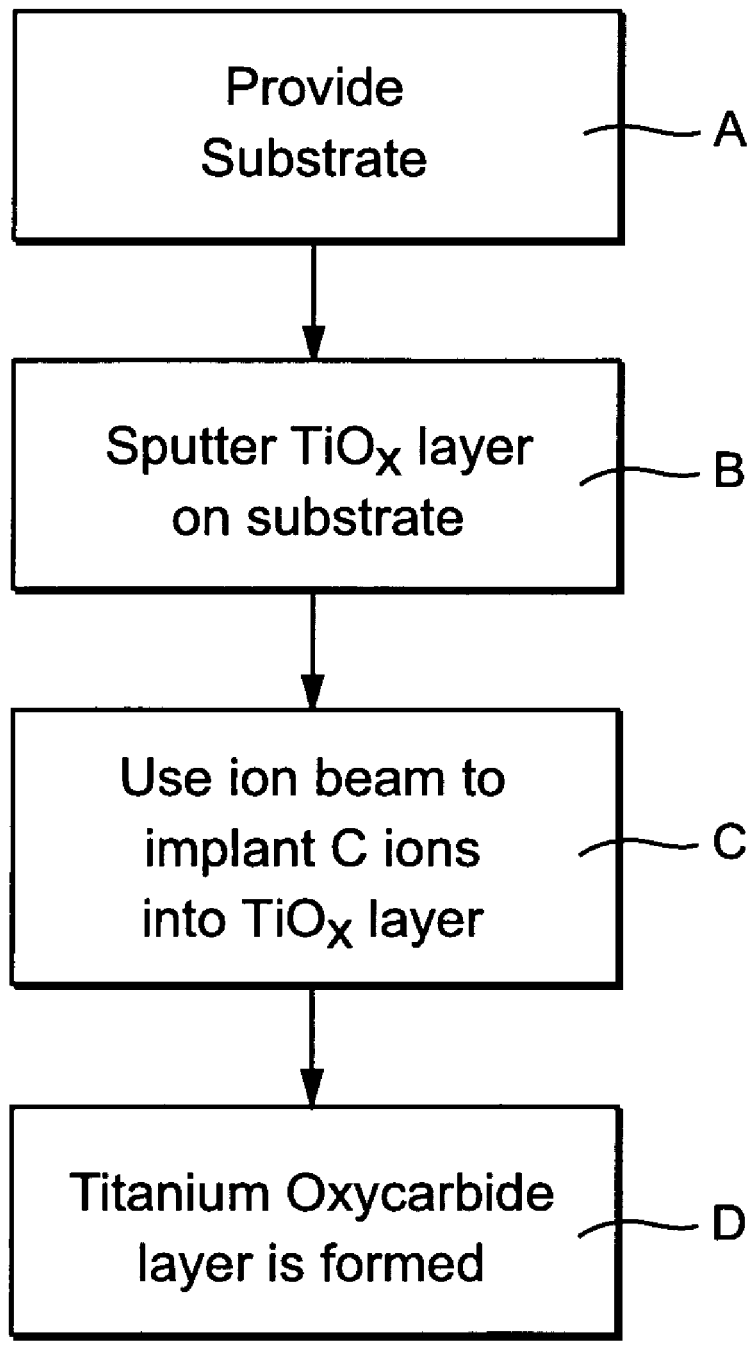
FIG. 2 is a flowchart illustrating certain steps performed in making the article of FIG. 1 according to an example embodiment of this invention.

FIG. 1 is a cross sectional view of a coated article being formed according to an example embodiment of this invention, whereas FIG. 2 sets forth steps that are carried out in making the coated article of FIG. 1. Referring to FIGS. 1–2, a substrate (e.g., glass substrate which may or may not include other layers) is provided (see step A in FIG. 2). An amorphous layer 3 of or including titanium oxide ($TiO_x$) is then deposited by sputtering on the substrate (see step B in FIG. 2). The sputtered titanium oxide of layer 3 may or may not be doped with other elements in different embodiments of this invention. Layer 3 may be from about 50 to 1,000 Å thick in certain example embodiments of this invention, more preferably from about 50 to 500 Å thick. After the $TiO_x$ inclusive layer 3 has been sputtered onto substrate, the coated article is moved in direction 5 as shown in FIG. 1 relative to at least one ion source 25. At least one gas including carbon (e.g., a hydrocarbon gas such as $C_2H_2$ or the like) is fed through or used in the ion source(s) so that the ion source(s) 25 causes an ion beam including carbon (C) ions to be emitted toward the $TiO_x$ inclusive layer 3 (see step C in FIG. 2). The C ions in the ion beam are provided with sufficient energy so that they can implant into the $TiO_x$ inclusive layer 3 as shown in FIG. 1. In FIG. 1, the dots illustrated in layer 3 represent C ions/atoms that have implanted into the sputtered layer 3; and the far right-hand portion of the layer 3 in FIG. 1 has no implanted dots because that portion of the coated article has not yet passed under the ion source. It is noted that the ion beam from source 25 may be focused, diffused, or collimated in different embodiments of this invention.

The implantation of C ions/atoms into the sputtered $TiO_x$ inclusive layer 3 causes a layer comprising titanium oxycarbide 3b to be formed at least proximate the surface of the layer as shown in FIG. 1 (see also step D in FIG. 2). This implantation of C ions/atoms into layer 3 causes the durability of the resulting layer to significantly improve relative to that of layer 3 before the C ions/atoms were implanted. For example, scratch resistant is significantly improved.

Figure 7:
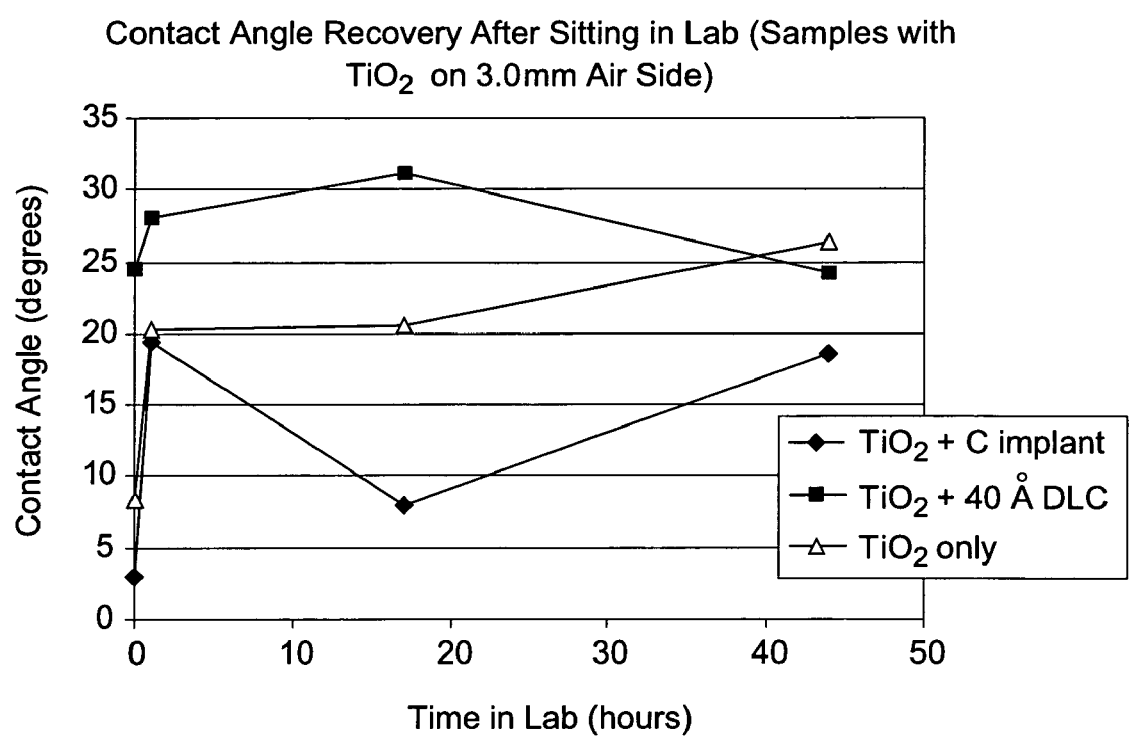
FIG. 7 is a time vs. contact angle $\theta$ graph comparing a sputtered layer of only $TiO_2$ to sputtered $TiO_2$ implanted with and/or covered with different amounts of C.

Moreover, it has surprisingly been found that the presence of the implanted carbon in the layer 3 enables the resulting amorphous layer's contact angle θ to be fairly low in certain instances relative to pure titanium oxide. For example, FIG. 7 illustrates that the implanted layer 3 can realize a lower initial contact angle θ than can a layer of only amorphous titanium oxide. Thus, one does not necessarily need microcrystalline $TiO_2$ (anatase or rutile) to induce low contact angles in a titanium oxide inclusive layer. Moreover, it has surprisingly been found that once the C ions/atoms have been implanted in layer 3, and a low contact angle θ has been achieved, the layer's ability to maintain a low contact angle(s) θ over time is significantly improved compared to the situation where the C ions/atoms were not implanted (see FIG. 7). Yet another surprising aspect of certain example embodiments of this invention is that the implantation of the C ions/atoms into layer 3 enables the implanted layer to realize hydrophilic behavior (low contact angle(s)) in the presence of green visible light without necessarily needing UV to induce lower contact angles). In other words, visible green light for example may cause the contact angle of the implanted layer to decrease which is advantageous in many commercial situations.

In certain example embodiments of this invention, the layer comprising titanium oxycarbide has a contact angle θ of no greater than about 20 degrees, more preferably no greater than about 15 degrees. This contact angle may be either an initial contact angle, or after exposure to UV radiation and water (QUV) for at least 50 hours. The QUV exposure is known in the art.

When implanting into the $TiO_x$ layer, the carbon ions have sufficient ion energy so as to knock off oxygen (O) from $TiO_x$ molecules so as to enable a substantially continuous layer comprising titanium oxycarbide 3b to form near a surface of the previously sputtered layer as shown in FIG. 1. FIG. 1 also illustrates an embodiment where the sputtered $TiO_x$ layer 3 was sufficiently thick so that the layer comprising titanium oxycarbide 3b (in the area of the implanted dots shown in FIG. 1) may be formed over a layer of $TiO_x$ 3a which was originally a lower portion 3a of the originally sputtered $TiO_x$ layer. In certain example embodiments, the titanium oxycarbide layer 3b may be characterized at least in part by $TiO_xC_y$, where x/y is from 0.5 to 1.5.

It is also believed that the implantation of the C ions/atoms into the layer 3 as shown in FIG. 1 can cause a heterojunction to occur between resulting layers 3a and 3b. This heterojunction is formed at the interface between layers 3a and 3b (or alternatively at the interface between semiconductive layer 3b and an overlying semiconductive layer comprising DLC), these layers having different bandgaps ($TiO_x$ is about 3.2 eV+/− about 0.1, and the DLC may have a bandgap of about 1.9 to 2.2 eV). Under chemical equilibrium conditions, the fermi levels are aligned in the two materials, so that band bending may occur. This band bending creates an internal field at the heterojunction. Charge accumulates at the interface. It is believed that when incident light (e.g., visible green light) hits this charge at the heterojunction, electron hole pairs form and cause contact angle θ to decrease.

A relatively high voltage is required in the ion source(s) 25 in order to provide sufficient energy for the carbon ions in the beam from the ion source to: (a) implant into the sputtered $TiO_x$ layer 3, (b) knock off oxygen from $TiO_x$ molecules, and (c) carry out (a) and (b) to an extent sufficient so that a substantially continuous layer of titanium oxycarbide 3b can be formed. In order to achieve sufficient energy in this respect, according to certain example embodiments of this invention the ion source(s) 25 uses an anode-cathode voltage of at least about 800 V, more preferably at least about 1,500 V, even more preferably at least about 2,000V, and still more preferably at least about 2,500 V. Even a source voltage of at least about 3,500 V may be used in certain instances.

The aforesaid "voltage" (or accelerating voltage) referred to which is used in the ion source(s) 25 to cause implantation of the C ions/atoms in layer 3, is the voltage between the anode and the cathode of the ion source 25. As is known in the art, "ion energy" is related to this anode/cathode "voltage" but is different therefrom. The molecular fragment ion energy is one half (½) of the accelerating voltage for molecular acetylene ($C_2H_2$) for example. Thus, the molecular fragment ion energy, given a voltage of 2,000 V would be 2,000/2=1,000 V. Moreover, in the case of C ions formed from acetylene ($C_2H_2$) used as a feedstock gas in the ion source, there are two carbon atoms per molecular fragment. Thus, the energy per carbon ion is the molecular fragment ion energy divided by 2 in this case where $C_2H_2$ is used as the feedstock gas to form the C ions in the beam. In other words, for purposes of example only, in the case where the C ions are formed using $C_2H_2$ as the feedstock gas in the ion source 25, ion source voltages (i.e., at least about 800 V, 1,500 V, 2,000 V and/or 2,500 V as explained above) translate into ion energies of at least about 200 eV per C ion, more preferably at least about 375 eV per C ion, even more preferably at least about 500 eV per C ion, and still more preferably at least about 625 eV per C ion.

In certain embodiments of this invention, it is important that one or more of the aforesaid ion source voltages and/or ion energies be used. This is because, if too low of an ion energy (or voltage in the ion source 25) is used (e.g., 75 eV per C ion is too low), C ion implantation and/or formation of a continuous layer comprising titanium oxycarbide cannot be achieved.

It will be recognized that when a hydrocarbon gas such as $C_2H_2$ is used as the feedstock gas in the source 25, the ions in the resulting beam will include both C ions and H ions. Thus, the titanium oxycarbide layer 3b may be doped with H in certain embodiments of this invention. In certain example embodiments, the layer 3b may include from 0 to 20% H, more preferably from about 1 to 18% H, and even more preferably from about 5 to 15% H. Other materials may also be present in layers 3a, 3b in certain instances, as shown in the XPS graphs discussed herein.

In certain embodiments of this invention, C ions are implanted deep enough into the sputtered $TiO_x$ layer 3 so as to enable a substantially continuous layer comprising titanium oxycarbide 3b to form at least proximate a top portion thereof. In certain example embodiments, at least some C ions (and/or C atoms) are implanted into the sputtered layer 3 to a depth "d" of at least 25 Å below the top surface of the sputtered layer (more preferably at least 50 Å, even more preferably at least 100 Å). Insufficient implantation may contribute to non-enhancement of durability, or the like, or very quick wearing off of the same.

In certain example embodiments of this invention, the ion source(s) 25 may be operated so as to only emit enough C ions toward layer 3 so as to cause C ion/atom implantation in layer 3 as shown in FIG. 1, but not to cause a layer of amorphous DLC (e.g., ta-C or ta-C:H) to form over the titanium oxycarbide layer 3b. Alternatively, in other embodiments of this invention, the source(s) 25 is operated so as to cause a thin layer (not shown) comprising amorphous DLC (e.g., ta-C or ta-C:H) to form over the titanium oxycarbide layer 3b. Example characteristics of such DLC layers are discussed in U.S. Pat. No. 6,261,693, hereby incorporated herein by reference. This thin DLC layer may be from about 1–30 Å thick in certain example embodiments, more preferably from about 1–20 Å thick. It is noted that other layers may also be provided over the oxycarbide in certain instances. Moreover, this very thin DLC inclusive layer may in certain embodiments be sacrificial in that it is designed so that it may wear away (i.e., disappear) over time. Thus, for example, such a thin layer comprising DLC may be used to protect the coated article from scratching or the like during shipping, process, or the like, and then wear off over time so as to expose the layer comprising titanium oxycarbide 3b which may be characterized by a more desirable low contact angle and/or good durability. It is also noted that in certain example embodiments, the titanium oxycarbide may be designed to be sacrificial, so that it wears away over time after its job of protecting the coating from scratching or the like during shipment, processing, or the like, has been fulfilled.

Optionally, this overlying layer comprising DLC may be even thicker than 30 Å in certain example instances. Such overlying DLC inclusive layer(s) herein may include a large amount of sp carbon-carbon bonds (e.g., at least 40% of C—C bonds in the layer may be such bonds, more preferably at least 50%), may or may not be hydrogenated (e.g., from about 1–25% H, more preferably from about 3–18% H) or include other dopants in different embodiments of this invention, and/or may have a density of at least 2.4 gms/cm$^3$ in certain example instances.

Figure 3:
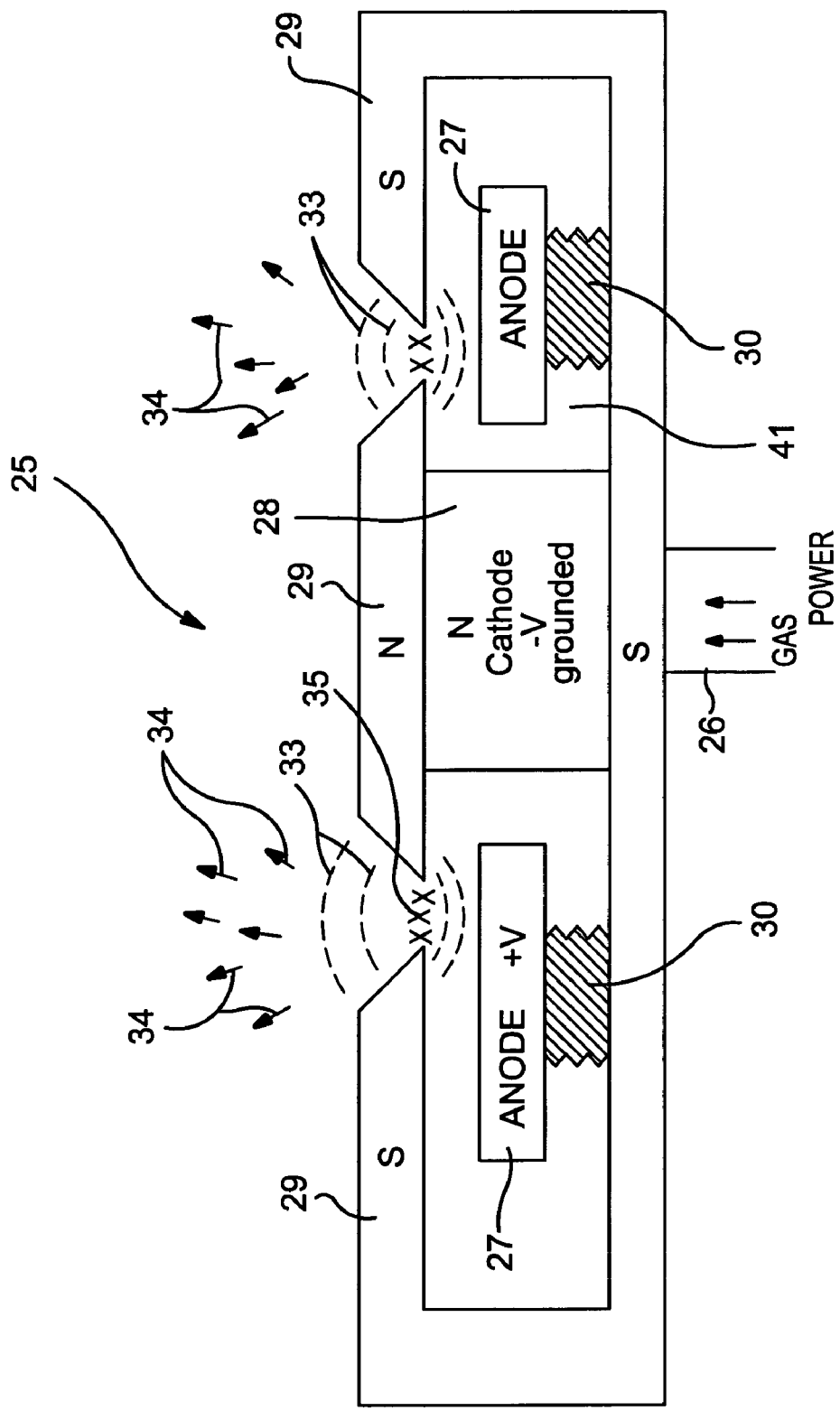
FIG. 3 is a sectional view of an example ion source which may be used to implant carbon ions into the originally sputtered titanium oxide inclusive layer of FIGS. 1–2 according to an example embodiment of this invention.
Figure 4:
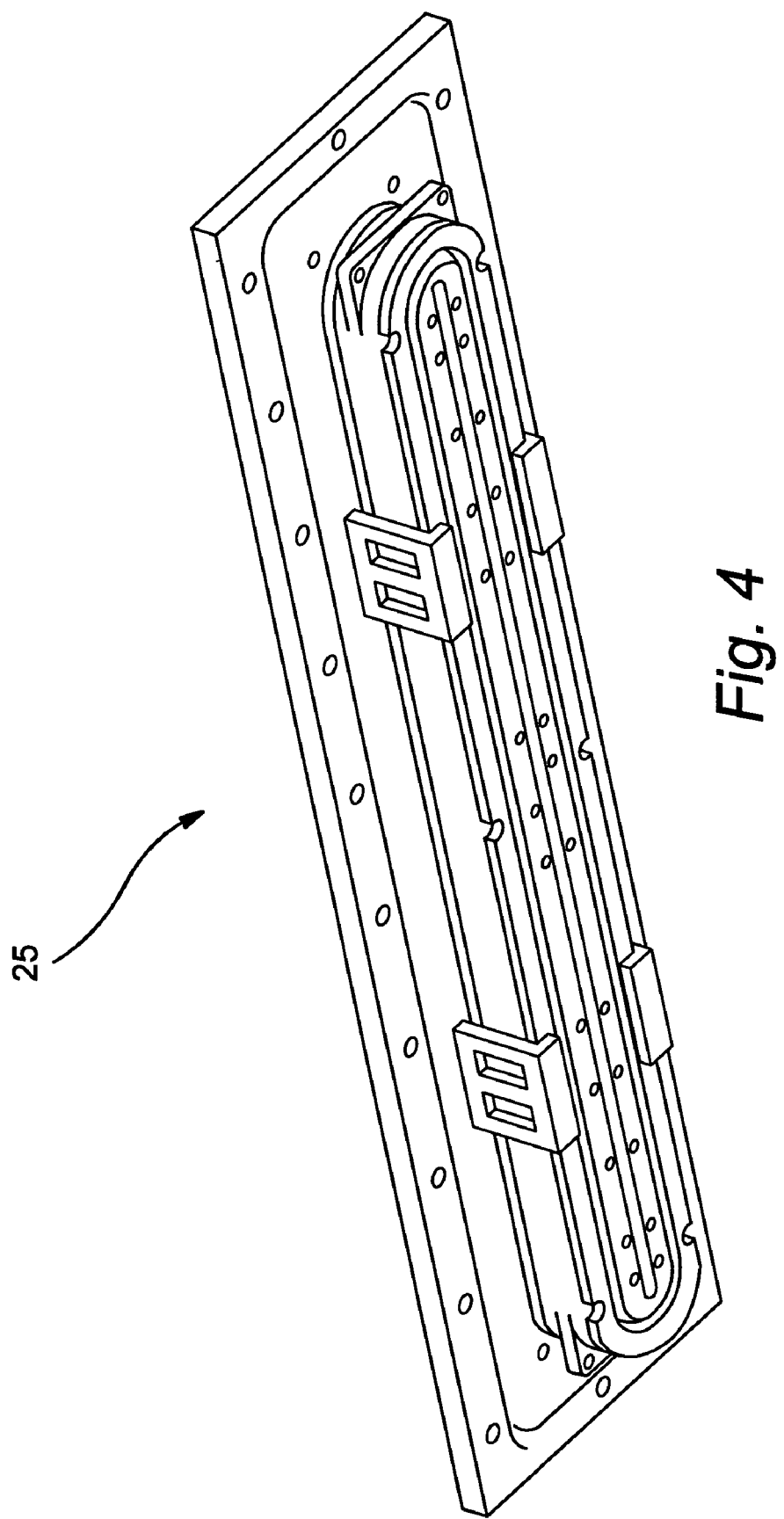
FIG. 4 is a perspective view of the ion source of FIG. 3.

FIGS. 3–4 illustrate an example ion source 25 which may be used to implant C ions in layer 3 according to certain example embodiments of this invention. Ion source 25 includes gas/power inlet 26, anode 27, grounded cathode magnet portion 28, cathode magnet portion 29, and insulators 30. A 3 kV (or other power supply amount) DC and/or AC power supply may be used for source 25 in some embodiments. The voltages described above are provided between the anode 27 and the cathode 29 of the ion source proximate the electric gap near the racetrack shaped slit in the cathode. Ion beam source 25 is based upon a known gridless ion source design. The linear source includes a linear shell (which is the cathode and may be grounded) inside of which lies a concentric anode (which is at a positive potential). This geometry of cathode-anode and magnetic field 33 gives rise to a closed drift condition. The source can also work in a reactive mode. The source may includes a metal housing with a slit in a shape of a race track as shown in FIGS. 3–4, the hollow housing being at ground potential in example instances. The anode electrode 27 is situated within the cathode body 28, 29 (though electrically insulated) and is positioned just below the slit. The anode 27 can be connected to a positive potential as high as 3,000 or more volts (V) (or as otherwise needed for the varying ion energies used herein). Both electrodes may be water cooled in certain embodiments. One or more feedstock or precursor gas (e.g., acetylene, other hydrocarbon gas, or any other suitable gas) is/are fed through the cavity between the anode and cathode (or alternatively may be otherwise provided at the source).

Still referring to FIGS. 3–4, electrical energy cracks the gas(es) to produce a plasma within the source 25. The ion beam emanating from the slit is approximately uniform in the longitudinal direction and has a Gaussian profile in the transverse direction. Exemplary ions 34 in the ion beam are shown in FIG. 3. A source as long as four meters may be made, although sources of different lengths are anticipated in different embodiments of this invention. Electron layer 35 completes the circuit thereby enabling the ion beam source to function properly. The ion beam source of FIGS. 3–4 is merely exemplary. Thus, in alternative embodiments of this invention, an ion beam source device or apparatus as described and shown in the first three figures of U.S. Pat. No. 6,002,208 (hereby incorporated herein by reference in its entirety) may be used. Any other suitable type of ion source may also be used.

In certain embodiments, the oxycarbide may be heated during and/or after the ion beam treatment, from for example from about 100 to 650 degrees C. This heating may make the surface more hydrophilic, and/or to enhance the formation of oxycarbides.

EXAMPLES

For purposes of example only, several examples were made and analyzed in accordance with different embodiments of this invention. In each of the below-listed examples, an amorphous TiO$_2$ layer 3 approximately 220–230 Å thick was magnetron sputtered onto a 3 mm thick glass substrate 1. Then, each sample was passed beneath an ion source 25 at a rate of 100 inches per minute, where the source 25 used acetylene gas to expel at least C ions toward the layer 3. The beam was incident on the layer 3 at an angle of about 90 degrees. In Example 1, the layers were deposited on the tin side of the float glass substrate 1, whereas in Examples 2–4 the layers were deposited on the air side (non-tin side) of the substrate 1. Processing for the implantation for each example is set forth below. Gas flows below are total gas flows of acetylene in units of sccm in the source, and voltage is the anode/cathode voltage in source 25.

TABLE 1

IMPLANTATION PROCESSING FOR EXAMPLES

| | Gas & Flow | Voltage | Current | Pressure |
|---|---|---|---|---|
| Example 1: | C$_2$H$_2$ 100 sccm | 4,500 V | 0.87 A | 0.30 mTorr |
| Example 2: | C$_2$H$_2$ 100 sccm | 3,000 V | 0.79 A | 0.32 mTorr |
| Example 3: | C$_2$H$_2$ 120 sccm | 3,000 V | 1.01 A | 0.35 mTorr |
| Example 4: | C$_2$H$_2$ 310 sccm | 3,000 V | 1.17 A | 0.99 mTorr |

Figure 5:
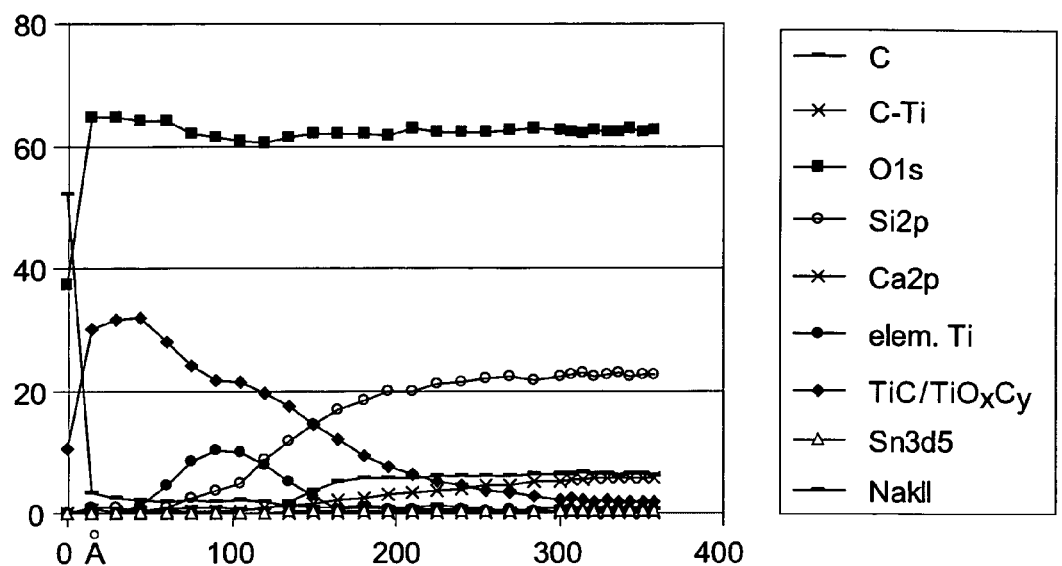
FIG. 5 is an XPS (X-ray Photoelectron Spectroscopy) graph illustrating the elements/components present in atomic amounts throughout the thickness of the layer system of Example 1 at a first location on the substrate.
Figure 6:
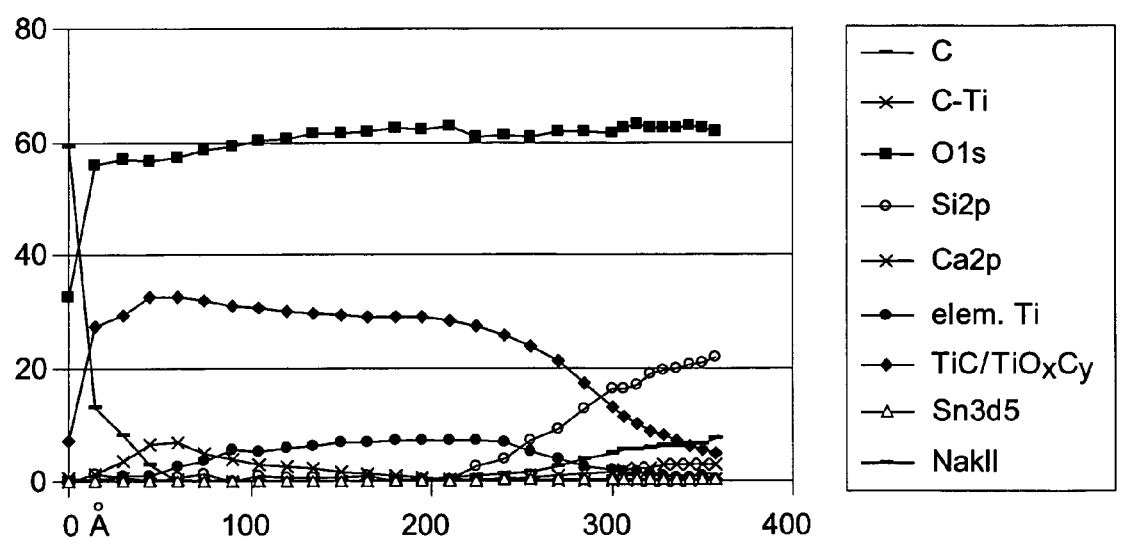
FIG. 6 is an XPS graph illustrating the elements/components present in atomic amounts throughout the thickness of the layer system of Example 1 at a second location on the substrate (different than the first location measured in FIG. 5).

Example 1 was analyzed via XPS, at two different locations illustrated in FIGS. 5 and 6. In the XPS analysis, 15 Å steps were used. FIG. 5 is an XPS graph illustrating the elements/components present in atomic amounts throughout the thickness of the layer system of Example 1 at a first location on the substrate, where in the graph the vertical axis represents atomic percent while the horizontal axis represents the depth into the coating from the exterior surface thereof in units of angstroms (Å) relative to sputtering of a silicon oxide layer as is known in the art. FIG. 6 is similar to FIG. 5, except that the data was measured at a different location on the Example 1 sample. The instrument used for the measuring was a Physical Electronics Quantum 2000 Scanning XPS, and the x-ray source was monochromatic Al Kα. The analysis area was 0.2 mm by 0.2 mm, and the take-off angle was 45 degrees. Sputter conditions used for the reference thickness were 1 keV Ar+, 2 mm×2 mm raster, ~30 Å/min vs. SiO$_2$.

As shown in FIGS. 5–6, on the surface the proportion of C—O relative to C—C/C—H appears to be similar in both areas. The O1s spectra reflects a mixture of metal oxides and hydroxide/organic. Moreover, it is noted that the coating thickness appears to be smaller in the location of FIG. 5 than in the location of FIG. 6 (the increase in Si content in FIGS.

5–6 is indicative of the presence of the glass substrate under the coating). The C1s spectra in the depth profile in FIG. 5 do not reveal the presence of TiC per se, rather it suggests an intermediate species of C in the matrix of $TiO_x$ (i.e., titanium oxycarbide), possibly bonded to both Ti and O (again, titanium oxycarbide). Thus, the phrase "titanium oxycarbide" as used herein includes TiOC bonding, and also situations where C is provided in a matrix of $TiO_x$ but need not necessarily be bonded thereto.

Unfortunately, severe peak interference in the Ti2p spectra prevented differentiation of TiC and TiO, which have nearly the same binding energy; and also precluded differentiation of various oxidic states due to Ti2p3 and Ti2p1 spectra interference. This leads us to use two labels for Ti, elemental Ti and $TiO_xC_y$/TiC. In FIG. 5, a significant proportion of Ti appears to be in elemental state near the glass substrate 1 interface, and not much TiC was observed judging from the lack of C—Ti peak in the C1s spectra. In contrast, C—Ti bonding was indeed present in the C1s spectra in FIG. 6 and it peaked at about 50 Å. The intermediate species of C in the matrix of $TiO_x$, as mentioned above, was also present in the C1s spectra in FIG. 6. FIG. 6 also illustrates a higher $TiO_xC_y$/TiC concentration around 50 Å, and significant titanium oxycarbide in this respect all the way through the layer 3, implying a fairly uniform distribution of the titanium oxycarbide component. In FIG. 6, elemental Ti was present in the film except for the top 50 Å. The film of Example 1 was also found to have a very low contact angle, which angle decreased upon exposure to visible light, and superior scratch resistance compared to titanium oxide.

FIG. 7 is a graph comparing Example 2 ($TiO_2$+C implant) vs. both a layer of only $TiO_2$ on a substrate and a layer of C implanted $TiO_2$ coated with a layer of DLC about 40 Å thick over the same. It can be seen that the coated article of Example 2 had lower initial contact angle than either of the other two articles, which is advantageous in certain instances. Moreover, FIG. 7 illustrates that Example 2 was able to maintain a low contact angle for a longer period of time than were the other two samples.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A method of making a coated article, the method comprising:
   providing a glass substrate;
   sputtering a layer comprising titanium oxide $TiO_x$ (where x is from 1 to 3) on the substrate, thereby forming a sputtered layer; and
   utilizing at least one ion source using anode-cathode voltage of at least about 1,500 V to cause at least carbon ions to be directed toward the sputtered layer comprising titanium oxide so that at least some of the carbon ions are implanted into the sputtered layer to a depth of at least 25 Å below a surface of the sputtered layer, so that a layer comprising titanium oxycarbide is an outermost layer of a coating of the coated article.

2. The method of claim 1, wherein said carbon ions are implanted into the sputtered layer so as to form a substantially continuous layer comprising titanium oxycarbide proximate the surface of the sputtered layer.

3. The method of claim 1, wherein said ion source uses anode-cathode voltage of at least about 2,000 V to cause said carbon ions to be directed toward the sputtered layer.

4. The method of claim 1, wherein said ion source uses anode-cathode voltage of at least about 3,500 V to cause said carbon ions to be directed toward the sputtered layer.

5. The method of claim 1 wherein said ion source uses anode-cathode voltage sufficient to cause at least some of the carbon ions directed toward the sputtered layer to have an ion energy of at least about 200 eV per carbon ion.

6. The method of claim 1, wherein said ion source uses anode-cathode voltage sufficient to cause at least some of the carbon ions directed toward the sputtered layer to have an ion energy of at least about 375 eV per carbon ion.

7. The method of claim 1, wherein said ion source uses anode-cathode voltage sufficient to cause at least some of the carbon ions directed toward the sputtered layer to have an ion energy of at least about 500 eV per carbon ion.

8. The method of claim 1, wherein said ion source uses anode-cathode voltage sufficient to cause at least some of the carbon ions directed toward the sputtered layer to have an ion energy of at least about 625 eV per carbon ion.

9. The method of claim 1, wherein said ion source uses anode-cathode voltage sufficient to cause at least some of the carbon ions to be implanted into the sputtered layer at a depth of at least 50 Å below the surface of the sputtered layer.

10. The method of claim 1, wherein said ion source uses anode-cathode voltage sufficient to cause at least some of the carbon ions to be implanted into the sputtered layer at a depth of at least 100 Å below the surface of the sputtered layer.

11. The method of claim 1, wherein the coated article has a contact angle θ of no greater than about 20 degrees.

12. The method of claim 1, wherein the coated article has a contact angle θ of no greater than about 15 degrees.

13. The method of claim 1, further comprising directing visible light toward the coated article which visible light causes a contact angle θ of the coated article to decrease.

14. The method of claim 1, wherein at least a hydrocarbon gas is used in the ion source, so that at least carbon ions and hydrogen ions are directed toward the sputtered layer in an ion beam.

15. The method of claim 1, wherein at least one additional layer is provided on the substrate between the sputtered layer comprising $TiO_x$ and the substrate.

16. The method of claim 1, wherein the layer comprising titanium oxide is amorphous.

17. The method of claim 1, wherein the coated article is a window.

18. A method of making a coated article, the method comprising:
   providing a substrate;
   sputtering a layer comprising titanium oxide on the substrate, thereby forming a sputtered layer;
   directing at least carbon ions toward the sputtered layer comprising titanium oxide, at least some of the carbon ions having an ion energy of at least 200 eV per carbon ion so that at least some of the carbon ions implant in the sputtered layer thereby forming a layer comprising titanium oxycarbide which is an outermost layer of the resulting coated article; and
   wherein at least some of the carbon ions implant into the sputtered layer to a depth of at least 25 Å below a surface of the sputtered layer.

19. The method of claim 18, wherein said carbon ions are implanted into the sputtered layer so as to form a substantially continuous layer comprising titanium oxycarbide proximate a surface of the sputtered layer.

20. The method of claim 18, further comprising using an ion source using anode-cathode voltage of at least about 2,000 V in directing said carbon ions toward the sputtered layer.

21. The method of claim 18, further comprising using an ion source using anode-cathode voltage of at least about 3,500 V in directing said carbon ions toward the sputtered layer.

22. The method of claim 18, wherein at least some of said carbon ions directed toward the sputtered layer have an ion energy of at least about 375 eV per carbon ion.

23. The method of claim 18, wherein at least some of said carbon ions directed toward the sputtered layer have an ion energy of at least about 500 eV per carbon ion.

24. The method of claim 18, wherein at least some of said carbon ions directed toward the sputtered layer have an ion energy of at least about 625 eV per carbon ion.

25. The method of claim 18, wherein at least some of the carbon ions implant into the sputtered layer to a depth of at least 50 Å below a surface of the sputtered layer.

26. The method of claim 18, wherein an ion source uses anode-cathode voltage sufficient to cause at least some of the carbon ions to be implanted into the sputtered layer at a depth of at least 100 Å below a surface of the sputtered layer.

27. The method of claim 18, wherein the coated article has a contact angle θ of no greater than about 20 degrees.

28. The method of claim 18, wherein the coated article has a contact angle θ of no greater than about 15 degrees.

29. The method of claim 18, further comprising directing visible light toward the coated article which visible light causes a contact angle θ of the coated article to decrease.

30. The method of claim 18, wherein at least a hydrocarbon gas is used in the ion source, so that at least carbon ions and hydrogen ions are directed toward the sputtered layer in an ion beam.

31. The method of claim 18, wherein at least one additional layer is provided on the substrate between the sputtered layer comprising titanium oxide and the substrate.

32. The method of claim 18, wherein the coated article is a window.

33. A method of making a coated article, the method comprising:
providing a substrate;
forming a layer comprising a metal oxide on the substrate;
directing at least carbon ions toward the layer comprising the metal oxide, at least some of the carbon ions having an ion energy of at least 200 eV per carbon ion so that at least some of the carbon ions implant in the layer thereby forming a layer comprising an oxycarbide which is an outermost layer of the resulting coated article; and
wherein at least some of the carbon ions implant into the layer to a depth of at least 25 Å below a surface of the layer.

34. The method of claim 33, wherein at least some of said carbon ions directed toward the layer have an ion energy of at least about 375 eV per carbon ion.

35. The method of claim 33, wherein at least some of said carbon ions directed toward the layer have an ion energy of at least about 500 eV per carbon ion.

36. The method of claim 33, wherein at least some of said carbon ions directed toward the layer have an ion energy of at least about 625 eV per carbon ion.

37. The method of claim 33, wherein said metal comprises Ti.

38. The method of claim 33, further comprising heating the layer comprising the metal oxide in order to enhance formation of oxycarbide.

39. The method of claim 33, wherein said metal comprises Ti.

40. The method of claim 33, wherein the coated article is a window.

41. A method of making a coated article, the method comprising:
providing a glass substrate;
sputtering a layer comprising a metal (M) oxide $MO_x$ (where x is from 1 to 3) on the substrate, thereby forming a sputtered layer; and
utilizing at least one ion source using anode-cathode voltage of at least about 1,500 V to cause at least carbon ions to be directed toward the sputtered layer comprising the metal oxide so that at least some of the carbon ions are implanted into the sputtered layer to a depth of at least 25 Å below a surface of the sputtered layer thereby forming a layer comprising oxycarbide; and
wherein the oxycarbide is at an outermost portion of a coating of the coated article so as to be exposed to surrounding atmosphere.

42. The method of claim 41, wherein a heterojunction is formed at the interface between the layer comprising oxycarbide and the layer comprising DLC.

43. The method of claim 42, wherein when incident visible light hits charge accumulated at the heterojunction, electron hole pairs form and cause contact angle θ to decrease.

44. A method of making a coated article, the method comprising:
providing a substrate;
forming a layer comprising a metal oxide on the substrate;
directing at least carbon ions toward the layer comprising the metal oxide, at least some of the carbon ions having an ion energy sufficient so as to cause at least some of the carbon ions to implant in the layer to a depth of at least 25 Å below a surface of the layer and form a layer comprising an oxycarbide, wherein the oxycarbide is at an outermost portion of the coated article and is exposed to surrounding atmosphere in the resulting coated article.

45. The method of claim 44, wherein the coated article is a window.

46. The method of claim 44, further comprising providing an additional layer on the substrate between the substrate and the layer comprising the metal oxide.

* * * * *